US007642584B2

(12) United States Patent
Yamazaki et al.

(10) Patent No.: US 7,642,584 B2
(45) Date of Patent: Jan. 5, 2010

(54) SEMICONDUCTOR DEVICE AND METHOD FOR FORMING THE SAME

(75) Inventors: Shunpei Yamazaki, Tokyo (JP);
Yasuhiko Takemura, Kanagawa (JP);
Akira Mase, Aichi (JP); Hideki Uochi,
Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 0 days.

(21) Appl. No.: 11/206,293

(22) Filed: Aug. 18, 2005

(65) Prior Publication Data

US 2006/0060852 A1 Mar. 23, 2006

Related U.S. Application Data

(60) Division of application No. 08/223,823, filed on Apr. 6, 1994, now Pat. No. 6,979,840, which is a continuation of application No. 07/949,135, filed on Sep. 23, 1992, now abandoned.

(30) Foreign Application Priority Data

Sep. 25, 1991 (JP) ................... 3-273377

(51) Int. Cl.
*H01L 27/108* (2006.01)
*H01L 29/94* (2006.01)
(52) U.S. Cl. .................. 257/296; 257/71; 257/291; 257/379; 257/E27.108; 257/E27.133
(58) Field of Classification Search ............ 257/59, 257/72, 75, 49, 359, E31.041, E27.1, E29.117, 257/E29.137, E29.276, 51, 66, 67, 69, 296, 257/297, 298, 288, 300, E27.114, E49.004, 257/632, 71, 291, 311, 379, E27.108, E27.133, 257/304
See application file for complete search history.

(56) References Cited

U.S. PATENT DOCUMENTS 3,275,915 A  9/1966  Harendza-Harinxma (Continued)

FOREIGN PATENT DOCUMENTS

EP       0 449 404 A    1/1991

(Continued)

OTHER PUBLICATIONS

Troxell et al., Polysilicon Thin-Film Transistors on a Novel 800° Glass Substrate, SID 86 Digest (May 1986), pp. 298-300.

(Continued)

*Primary Examiner*—Matthew Smith
*Assistant Examiner*—Quovaunda Jefferson
(74) *Attorney, Agent, or Firm*—Nixon Peabody LLP; Jeffrey L. Costellia

(57) ABSTRACT

A thin-film semiconductor device or integrated circuit comprising an insulating substrate, TFTs (thin-film transistors) formed on the substrate, and multilayer conductive interconnections. The circuit has a first metallization layer becoming gate electrodes and gate interconnections. The surface of the first metallization layer is oxidized by anodic oxidation to form an insulating coating on the surface of the first metallization layer. A second metallization layer becoming source and drain electrodes or conductive interconnections is then formed on the insulating coating directly or via an interlayer insulator. An improvement in the production yield and improved reliability are accomplished.

16 Claims, 10 Drawing Sheets

U.S. PATENT DOCUMENTS

| | | | |
|---|---|---|---|
| 3,878,549 A | 4/1975 | Yamazaki et al. | |
| 4,167,018 A | 9/1979 | Ohba et al. | |
| 4,217,374 A | 8/1980 | Ovshinsky et al. | |
| 4,288,256 A | 9/1981 | Ning et al. | |
| 4,335,161 A | 6/1982 | Luo | |
| 4,345,248 A | 8/1982 | Togashi et al. | |
| 4,379,020 A | 4/1983 | Glaeser et al. | |
| 4,400,256 A | 8/1983 | Riley | |
| 4,438,723 A | 3/1984 | Cannella et al. | |
| 4,445,134 A | 4/1984 | Miller | |
| 4,468,853 A | 9/1984 | Morita et al. | |
| 4,468,855 A | 9/1984 | Sasaki | |
| 4,470,852 A | 9/1984 | Ellsworth | |
| 4,508,609 A | 4/1985 | Moustakas et al. | |
| 4,528,082 A | 7/1985 | Moustakas et al. | |
| 4,600,274 A * | 7/1986 | Morozumi | 349/109 |
| 4,619,034 A | 10/1986 | Janning | |
| 4,692,994 A | 9/1987 | Moniwa et al. | |
| 4,727,044 A | 2/1988 | Yamazaki | |
| 4,731,642 A | 3/1988 | Katto et al. | |
| 4,732,659 A | 3/1988 | Schachter et al. | |
| 4,746,628 A * | 5/1988 | Takafuji et al. | 438/164 |
| 4,761,058 A | 8/1988 | Okubo et al. | |
| 4,769,338 A | 9/1988 | Ovshinsky et al. | |
| 4,772,927 A * | 9/1988 | Saito et al. | 257/66 |
| 4,777,150 A | 10/1988 | Deneuville et al. | |
| 4,800,174 A | 1/1989 | Ishihara et al. | |
| 4,808,553 A | 2/1989 | Yamazaki | |
| 4,808,554 A | 2/1989 | Yamazaki | |
| 4,814,292 A | 3/1989 | Sasaki et al. | |
| 4,851,363 A | 7/1989 | Troxell et al. | |
| 4,889,583 A | 12/1989 | Chen et al. | |
| 4,900,646 A | 2/1990 | Senske et al. | |
| 4,940,523 A | 7/1990 | Takeshima | |
| 4,951,601 A | 8/1990 | Maydan et al. | |
| 4,954,855 A | 9/1990 | Mimura et al. | |
| 4,956,680 A * | 9/1990 | Tanaka et al. | 257/20 |
| 4,988,642 A | 1/1991 | Yamazaki | |
| 5,003,356 A * | 3/1991 | Wakai et al. | 257/390 |
| 5,034,340 A | 7/1991 | Tanaka et al. | |
| 5,037,514 A | 8/1991 | Yamazaki | |
| 5,047,360 A | 9/1991 | Nicholas | |
| 5,049,523 A | 9/1991 | Coleman | |
| 5,054,887 A * | 10/1991 | Kato et al. | 349/42 |
| 5,068,699 A | 11/1991 | Chang | |
| 5,112,764 A | 5/1992 | Mitra et al. | |
| 5,124,823 A | 6/1992 | Kawasaki et al. | |
| 5,132,754 A | 7/1992 | Serikawa et al. | |
| 5,132,821 A | 7/1992 | Nicholas | |
| 5,141,885 A | 8/1992 | Yoshida et al. | |
| 5,146,301 A | 9/1992 | Yamamura et al. | |
| 5,162,901 A * | 11/1992 | Shimada et al. | 349/39 |
| 5,166,085 A | 11/1992 | Wakai et al. | |
| 5,166,816 A * | 11/1992 | Kaneko et al. | 257/59 |
| 5,177,577 A * | 1/1993 | Taniguchi et al. | 257/59 |
| 5,210,050 A | 5/1993 | Yamazaki et al. | |
| 5,248,630 A | 9/1993 | Serikawa et al. | |
| 5,278,093 A | 1/1994 | Yonehara | |
| 5,283,566 A | 2/1994 | Mimura et al. | |
| 5,289,030 A | 2/1994 | Yamazaki et al. | |
| 5,306,651 A | 4/1994 | Masumo et al. | |
| 5,308,998 A | 5/1994 | Yamazaki et al. | |
| 5,313,075 A | 5/1994 | Zhang et al. | |
| 5,315,132 A | 5/1994 | Yamazaki | |
| 5,359,206 A | 10/1994 | Yamamoto et al. | |
| 5,420,048 A | 5/1995 | Kondo | |
| 5,459,090 A | 10/1995 | Yamazaki et al. | |
| 5,514,879 A | 5/1996 | Yamazaki | |
| 5,521,107 A | 5/1996 | Yamazaki et al. | |
| 5,523,240 A | 6/1996 | Zhang et al. | |
| 5,523,605 A | 6/1996 | Yamazaki et al. | |
| 5,543,636 A | 8/1996 | Yamazaki | |
| 5,545,571 A | 8/1996 | Yamazaki et al. | |
| 5,561,075 A | 10/1996 | Nakazawa | |
| 5,568,288 A | 10/1996 | Yamazaki et al. | |
| 5,572,047 A | 11/1996 | Hiroki et al. | |
| 5,583,366 A | 12/1996 | Nakazawa | |
| 5,592,008 A | 1/1997 | Yamazaki et al. | |
| 5,604,137 A | 2/1997 | Yamazaki et al. | |
| 5,614,732 A | 3/1997 | Yamazaki | |
| 5,753,542 A | 5/1998 | Yamazaki et al. | |
| 5,780,313 A | 7/1998 | Yamazaki | |
| 5,859,445 A | 1/1999 | Yamazaki | |
| 6,011,277 A | 1/2000 | Yamazaki | |
| 6,177,302 B1 | 1/2001 | Yamazaki et al. | |
| 6,261,877 B1 | 7/2001 | Yamazaki et al. | |
| 6,369,788 B1 | 4/2002 | Yamazaki et al. | |
| 6,566,175 B2 | 5/2003 | Yamazaki et al. | |
| 6,607,947 B1 | 8/2003 | Zhang et al. | |
| 6,849,872 B1 | 2/2005 | Yamazaki et al. | |
| 2001/0050664 A1 | 12/2001 | Yamazaki et al. | |

FOREIGN PATENT DOCUMENTS

| | | | |
|---|---|---|---|
| EP | 0 449 404 B1 | | 10/1991 |
| EP | 0 459 763 A1 | | 12/1991 |
| EP | 0 485 233 A2 | | 5/1992 |
| EP | 0 486 284 A2 | | 5/1992 |
| JP | 55-050664 | | 4/1980 |
| JP | 56-046522 | | 4/1981 |
| JP | 56-111258 | * | 9/1981 |
| JP | 58-023479 | | 2/1983 |
| JP | 58-028873 | | 2/1983 |
| JP | 58-093092 | | 6/1983 |
| JP | 58-118154 | | 7/1983 |
| JP | 59-108360 | | 6/1984 |
| JP | 60-014474 | | 1/1985 |
| JP | 60-138909 | | 7/1985 |
| JP | 60-170972 | | 9/1985 |
| JP | 60-257172 | | 12/1985 |
| JP | 61-183970 | | 8/1986 |
| JP | 62-005662 | | 1/1987 |
| JP | 62-030379 | | 2/1987 |
| JP | 62-063475 | | 3/1987 |
| JP | 62-095860 | | 5/1987 |
| JP | 62-104171 | | 5/1987 |
| JP | 62-104172 | | 5/1987 |
| JP | 62-105474 | | 5/1987 |
| JP | 62-261128 | | 11/1987 |
| JP | 63-076474 | | 4/1988 |
| JP | 63-156325 | | 6/1988 |
| JP | 63-168052 | | 7/1988 |
| JP | 63-261875 | * | 10/1988 |
| JP | 64-030272 | | 2/1989 |
| JP | 64-031967 | | 2/1989 |
| JP | 64-035959 | | 2/1989 |
| JP | 64-035961 | | 2/1989 |
| JP | 64-089464 | | 4/1989 |
| JP | 01-129234 | | 5/1989 |
| JP | 01-179365 | | 7/1989 |
| JP | 01-183853 | | 7/1989 |
| JP | 01-184928 | | 7/1989 |
| JP | 01-222468 | | 9/1989 |
| JP | 01-255831 | | 10/1989 |
| JP | 01-274116 | | 11/1989 |
| JP | 89-012909 | | 12/1989 |
| JP | 02-102573 | | 4/1990 |
| JP | 02-130932 | | 5/1990 |
| JP | 02-177443 | | 7/1990 |
| JP | 02-222547 | | 9/1990 |
| JP | 02-238666 | | 9/1990 |
| JP | 02-239615 | | 9/1990 |
| JP | 02-260540 | | 10/1990 |
| JP | 03-036767 | | 2/1991 |

| | | |
|---|---|---|
| JP | 03-093236 | 4/1991 |
| JP | 03-095938 | 4/1991 |
| JP | 03-095939 | 4/1991 |
| JP | 03-165575 | 7/1991 |
| JP | 03-203322 | 9/1991 |
| JP | 03-280018 | 12/1991 |
| JP | 04-177735 | 6/1992 |
| JP | 04-181780 | 6/1992 |
| JP | 04-190329 | 7/1992 |
| JP | 04-196171 | 7/1992 |
| JP | 04-360580 | 12/1992 |
| WO | WO89/02095 * | 3/1989 |
| WO | WO 89-12909 | 12/1989 |

OTHER PUBLICATIONS

Suyama et al., "Electrical Conduction mechanism and Breakdown Property in Sputter-Deposited Silicon Dioxide Films on Polycrystalline Silicon," J. Appl. Phys., vol. 65, No. 1, Jan. 1, 1989, pp. 210-214.

Stein et al., "Properties of Magnetron Sputtered Hydrogenated Amorphous Silicon," Journal of Electronic Materials, vol. 10, No. 4, Jul. 1981, pp. 797-810.

Haberle et al., "Electrical Properties and Structure of Boron-Doped Sputter-Deposited Polycrystalline Silicon Films," Thin Solid Films, 61 (1979) pp. 105-113.

Tadashi Serikawa et al., "Low-Temperature Fabrication of High-Mobility Poly-Si TFT's for Large-Area LCD's," Proceedings of the SID, vol. 30, No. 2, 1989, pp. 137-141.

Shiro Suyama et al., "Electrical Characteristics of MOSFETS's Utilizing Oxygen-Argon SputSputter Deposited Gate Oxide Films" IEEE Transactions on Electronic Devices, vol. ED-34, No. 10, Oct. 1987, pp. 2124-2128.

Kunio Masumo, "Low Temperature Polysilicon TFTs by Non-Mass-Separated Ion Flux Doping Technique," Extended Abstracts of the 22nd (1990 International) Conferences on Solid State Device and Materials, Sendai, 1990, pp. 975-978.

A. Kolodziej et al. "Characteristics of Hydrogenated Amorphous Silicon Thin Film Transistors Fabricated by D.C. Magnetron Sputtering" Thin Solid Films, vol. 175, No. 1, Aug. 1989, Luasanne CH, pp. 37-42.

Thomas et al., "CW Laser Annealing of Hydrogenated Amorphous Silicon Obtained by RF Sputtering", Journal of Applied Physics, 52(1), pp. 476-479.

Wolf et al., "Silicon Processing for the VLSI Era Volume 1: Process Technology", pp. 516-520, Lattice Press.

Patent Abstracts of Japan, vol. 10, No. 125 (E-402) May 10, 1986 & JP-A-60 257 172 (Nippon Denshi Denwa Kosha) Dec. 18, 1985.

Patent Abstracts of Japan, vol. 8, No. 4, (E-220) Jan. 10, 1984 & JP-A-58 170 064 (Tokyo Shibaura Denki K.K.) Oct. 6, 1983.

Patent Abstracts of Japan, vol. 9, No. 189, (E-333) Aug. 6, 1985 & JP-A-60 057 975 (Matsushita Denski Sangyo K.K.) Apr. 3, 1985.

Patent Abstracts of Japan, vol. 13, No. 220 (E-762) May 23, 1989 & JP-A-01 031 466 (N.T.T. Corp.) Feb. 1, 1989.

Patent Abstracts of Japan, vol. 10, No. 107, (C-341) Apr. 22, 1986 & JP-A-60 238 479 (Nichiden Anelva K.K.) Nov. 27, 1985.

Patent Abstracts of Japan, vol. 12, No. 56 (C-477) Feb. 19, 1988 & JP-A-62 202 078 (Seiko Epson Corp.) Sep. 5, 1987.

Thomas et al., "CW Laser Annealing of Hydrogenated Amorphous Silicon Obtained by RF Sputtering", Journal of Applied Physics, 52(1), pp. 476-479, 1981.

Wolf et al., "Silicon Processing for the VLSI Era Volume 1: Process Technology", pp. 516-520, Lattice Press, 1986.

'Office Action (Application No. 200510008063.2; CN01975D1D2D1D1) Dated Sep. 25, 2009,".

* cited by examiner

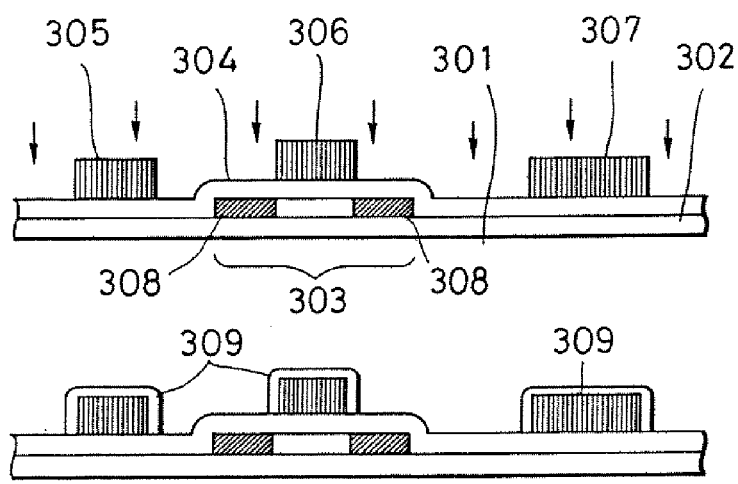
FIG. 3(A)
FIG. 3(B)
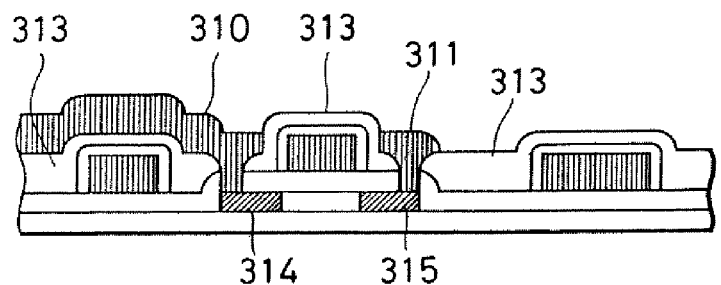
FIG. 3(C)
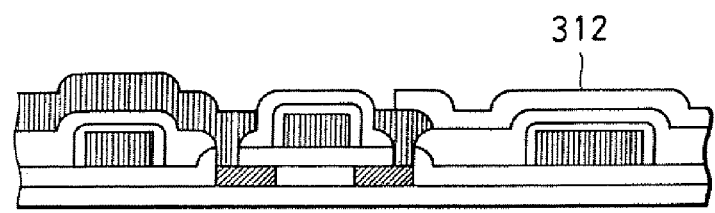
FIG. 3(D)

SEMICONDUCTOR DEVICE AND METHOD FOR FORMING THE SAME

FIELD OF THE INVENTION

The present invention relates to a highly reliable semiconductor device or semiconductor integrated circuit which is formed on an insulating substrate and can be mass-produced with a high production yield. The present invention also relates to a method of fabricating such a semiconductor device or integrated circuit. The invention can be applied to a circuit for driving a liquid crystal display or a thin-film image sensor and also to a three-dimensional integrated circuit.

BACKGROUND OF THE INVENTION

In recent years, it has been attempted to form a semiconductor integrated circuit on an insulating substrate made of a glass or sapphire, because the parasitic capacitance between the substrate and the conductive interconnections is reduced, thus improving the operating speed. Especially, where glass materials such as quartz are used, no limitations are imposed on the size of the substrate, unlike silicon wafers. Also, glass materials are inexpensive. In addition, it is easy to provide isolation between devices. Furthermore, latchup which presents problems in the case of CMOS monolithic integrated circuits does not take place. These reasons apart, it is necessary to integrate semiconductor devices with liquid crystal devices (elements) or photosensitive devices (elements) in the case of a liquid crystal display or intimate contact type image sensor. Therefore, thin-film transistors (TFTs) are required to be formed on a transparent plate or substrate.

For these reasons, thin-film semiconductor devices have been fabricated on an insulating substrate. However, the conventional thin-film semiconductor devices are fabricated by the same manufacturing steps as are used to form a semiconductor integrated circuit, or a monolithic integrated circuit, on a semiconductor substrate and, therefore, a quite large number of masks are required for the fabrication. In the conventional monolithic integrated circuit, a single crystal of silicon forming the substrate is quite excellent in reliability and hardly suffers from deformation due to thermal treatment or other problems. Consequently, alignment error rarely occurs in mask alignment steps.

However, generally commercially available insulating substrates are inferior in reliability to silicon substrates. Especially, substrates made of glasses are deformed unpredictably by thermal treatment and so the designed masks fail to fit the substrates. In this way, mask alignment steps are sometimes very difficult to carry out.

Where a liquid crystal display or the like is fabricated, it is necessary to fabricate an integrated circuit in a much larger area than the prior art integrated circuit. This further complicates the mask alignment steps. Accordingly, there is a demand for a reduction in the number of mask alignment steps.

SUMMARY OF THE INVENTION

It is an object of the present invention to provide a method for forming a semiconductor device or an integrated circuit on an insulating substrate with a reduced number of mask alignment steps.

It is another object of the invention to provide a method for forming a semiconductor device or an integrated circuit having improved reliability with an improved production yield.

It is a further object of the present invention to provide a semiconductor device or a semiconductor integrated circuit with little short circuit therein.

Where an integrated circuit is formed on an insulating substrate, electrostatic breakdown of devices often poses a problem, because static electricity tends to be produced on an insulating substrate, and because it is difficult to remove such static electricity. Especially, in the case of electrostatic breakdown between different layers of conductive interconnections, e.g., in the case of a liquid crystal display, breakdown at one location disables one row and one column. However, it is impossible for the other portions to compensate for the function of the disabled portions, unlike semiconductor memories. Hence, the resulting damage is great.

The present invention solves the foregoing problems by introducing a process totally different from the prior art process. In particular, instead of a part or all of the interlayer insulator used in the prior art integrated circuit, an oxide formed by oxidizing a lower conductive interconnection layer is used. Thus, the number of mask alignment steps is reduced, or the voltage-resistance between plural conductive interconnection layers is improved.

Other objects and features of the invention will appear in the course of the description thereof which follows.

BRIEF DESCRIPTION OF THE DRAWINGS

FIG. 3, (A)-(D), are cross-sectional views of other thin-film transistors according to the invention, for illustrating steps successively performed to fabricate the transistors;

DETAILED DESCRIPTION OF THE INVENTION

Figure 1:
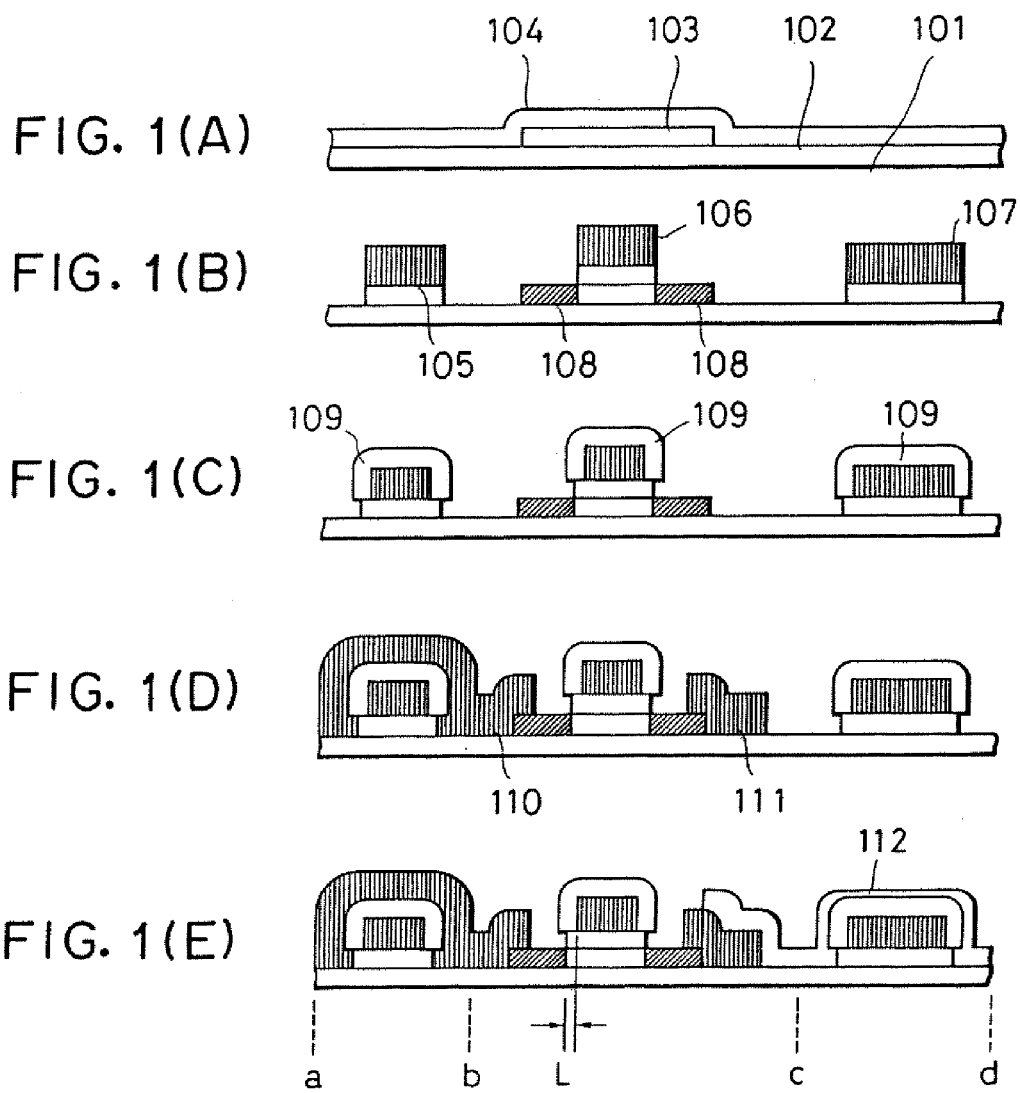
FIG. 1, (A)-(E), are cross-sectional views of thin-film transistors according to the invention, for illustrating steps successively performed to fabricate the transistors.

Referring to FIG. 1, (A)-(E), a silicon oxide film 102 is first formed as a passivation film on an insulating surface of a substrate 101. The thickness of the silicon oxide film 102 is 100 to 1000 nm. A semiconductor film is formed on the silicon oxide film. The passivation film acts to prevent movable ions such as sodium ions from moving into the overlying semiconductor region from the substrate; otherwise the semiconductor characteristics would be deteriorated. This passivation film can consist of a single layer or plural layers of silicon nitride, silicon oxide, and aluminum oxide, for example. Where the purity of the substrate is sufficiently high and the amount of moving ions is small, it is not necessary to form this passivation film. The semiconductor film can be amorphous silicon, polycrystalline silicon, or microcrystal silicon. This semiconductor film is etched to form a semiconductor region 103.

An insulating film is formed on the substrate (the insulating surface of the substrate) and the semiconductor region 103. Since this insulating film is used as a gate-insulating film, it is desired that the characteristics of the interface with the underlying semiconductor region be excellent and that the insulating film contain only a small amount of defects forming carrier trap centers and interface levels. For example, the insulating film is preferably made of a silicon oxide film formed by ECR CVD. Also, the insulating film may consist of plural insulating films stacked on top of each other. The thickness of this insulating film is determined, taking account of the fact that it is used as a gate-insulating film. Typically, the thickness is between 50 and 500 nm. In this way, a laminate shown in FIG. 1(A) is obtained.

Subsequently, a metal or metal silicide film, e.g. consisting mainly of aluminum, is formed on the insulating film. If this metal or metal silicide film consists either of pure aluminum or of aluminum containing almost no impurities, then a sufficient strength will not be obtained. Where the laminate is vulnerable to a mechanical force as encountered when electromigration is utilized, the film is made of aluminum to which 1-10% silicon is added. Titanium, tantalum, or a combination thereof may be used instead of the aluminum. Oxide films can be formed from these metals by anodic oxidation. These oxide films are excellent in voltage-resistance. It is to be noted in selecting the used metal that titanium oxide and tantalum oxide have much larger dielectric constants than that of aluminum oxide. Therefore, if an interlayer insulator is made of a material having such a large dielectric constant, then a large dielectric loss may be produced. Also, it must be noticed in selecting the material that tantalum and titanium have higher resistivities than that of aluminum. Among first conductive interconnections, gate interconnections (wirings) are required to respond at a higher speed and to show less electrostatic loss with the upper conductive interconnections. Preferably, the gate interconnections (wirings) are made of aluminum, while storage capacitive interconnections that are required to respond at lower speeds and to act rather as capacitors are made of tantalum or titanium. Of course, in this case, the number of masks used is increased by one. The metal or metal silicide film formed in this way is selectively removed by patterning to form on the insulating film a gate electrode 106, a gate interconnection 105 extending from the gate electrode (a wiring 105 connected with the gate electrode), and a storage capacitive interconnection 107 acting as an electrode for a capacitor. This capacitive interconnection 107 is used independent of the gate interconnection (wiring). The gate electrode may comprise a single layer comprising a material selected form the group consisting of aluminum, titanium, tantalum, aluminum silicide, titanium silicide and tantalum silicide. The gate electrode may comprise a multi-layer of a first metal layer and a second metal layer provided on said first metal layer. Further, the gate electrode may comprise a multi-layer of a phosphorus doped silicon film and a metal film provided on the silicon film.

Then, dopant atoms are implanted into the semiconductor region by a well-known dopant diffusion method such as ion implantation or plasma doping to form doped regions 108. At this time, the gate electrode 106 acts as a mask during the dopant implantation. Therefore, the doped regions are formed by a self-aligned process. The resulting laminate is shown in FIG. 1(B).

Then, the whole laminate is immersed in an appropriate electrolytic solution. The gate interconnection (wiring) and the storage capacitive interconnection are connected with a power supply, and a DC or AC current is supplied to oxidize the interconnections (the upper and the side surfaces of the interconnections and the gate electrode) by anodic oxidation to form an oxide film 109 on the surfaces (the upper and the side surfaces) of the gate interconnection (wiring), the gate electrode, the storage capacitive electrode, etc. Where the conductive interconnections are made of aluminum, titanium, or tantalum, a coating of aluminum oxide, titanium oxide, or tantalum oxide, respectively is formed. These oxide films do not consist only of a metal and oxygen; rather elements forming an electrolyte may be contained in the films, or the oxide films may produce a hydrate. Therefore, the physical properties are varied. For instance, where an organic acid is used as the electrolyte, carbon is contained in the oxide films. Where sulfuric acid is employed as the electrolyte, sulfur is contained in the oxide films. A material containing alkali metal ions should not be used as the electrolyte, because if alkali metal ions such as sodium ions and potassium ions enter the semiconductor region, then the conduction characteristics of the semiconductor are severely deteriorated.

The thickness of the oxide films is determined by the requisite voltage-resistance. During this oxidation step, the gate electrode recedes and so the thickness of the oxide film is determined also taking account of the overlap between the gate electrode and the doped regions. Typically, the thickness of the oxide films is 10 to 1000 nm.

Where only the gate interconnection (wiring) is connected with the power supply and the storage capacitive interconnection is not connected, an oxide film is formed only on the gate interconnection (wiring). Substantially no oxide film is formed on the storage capacitive interconnection except for a natural oxide film. The energization time, the energization current, the energization voltage, or other factor may be varied among the conductive interconnections. In this way, the thickness of the formed oxide films can be varied. Where the oxide films are used as an interlayer insulator, it is desired to increase the film thickness, for reducing the capacitance between the conductive interconnections. On the other hand, where the oxide films are used as an insulator for capacitors such as storage capacitors, it is desired to reduce the thickness. Where the purpose differs in this way, the use of the above-described procedure is effective.

After the conductive interconnections are coated with oxide films, the laminate is taken out of the solution and dried well. If necessary, the laminate is exposed to hot water or hot vapor to modify the quality of the oxide films. In particular, where especially thick films are obtained by anodic oxidation, the obtained films are porous. These films may be unsatisfactory in voltage-resistance, though they are thick. Also, in subsequent steps, an electrical short circuit may take place through holes. In this case, the oxide films are reacted with hot water to form a hydrate, thus increasing the volume. As a result, the holes are plugged up. In this way, a dense film excellent in electrical insulation is obtained. In any case, the laminate is sufficiently cleaned to prevent the electrolyte from remaining on the coating. Then, the laminate is dried. The resulting laminate is shown in FIG. 1(C).

Then, a metal coating (film) is formed in contact with the oxidized surface 109 on the metal or metal silicide film and patterned into drain interconnection and drain electrode 110 and a source electrode 111. The drain electrode is connected with a drain region 108 provided in the semiconductor region 103. In multilayer interconnections of a matrix circuit or the like, the conductive interconnections formed as described above may be required to intersect the conductive interconnections formed first. In the past, after the first conductive interconnections are formed, an interlayer insulator is formed from an insulating material. Upper conductive interconnections are formed on the interlayer insulator. In the present invention, no interlayer insulator is formed; the upper conductive interconnections are formed directly on the underlying conductive interconnections because the underlying interconnections have been already coated with an oxide film. Therefore, at this stage, the number of the masks can be reduced by one, compared with the prior art process. The resulting laminate is shown in FIG. 1(D).

In accordance with the present invention, three masks are needed to obtain the laminate of FIG. 1(D). The first mask is used for formation of the semiconductor region. The second mask is used for formation of the first metal interconnections. The third mask is used for formation of the second metal interconnections. In the past, four masks have been required. The first one is used for formation of a semiconductor region. The second one is used for formation of first metal interconnections. The third one is used for formation of source electrodes of transistors, i.e., windows are formed in the interlayer insulator. The fourth one is used to form second metal interconnections.

Figure 2:
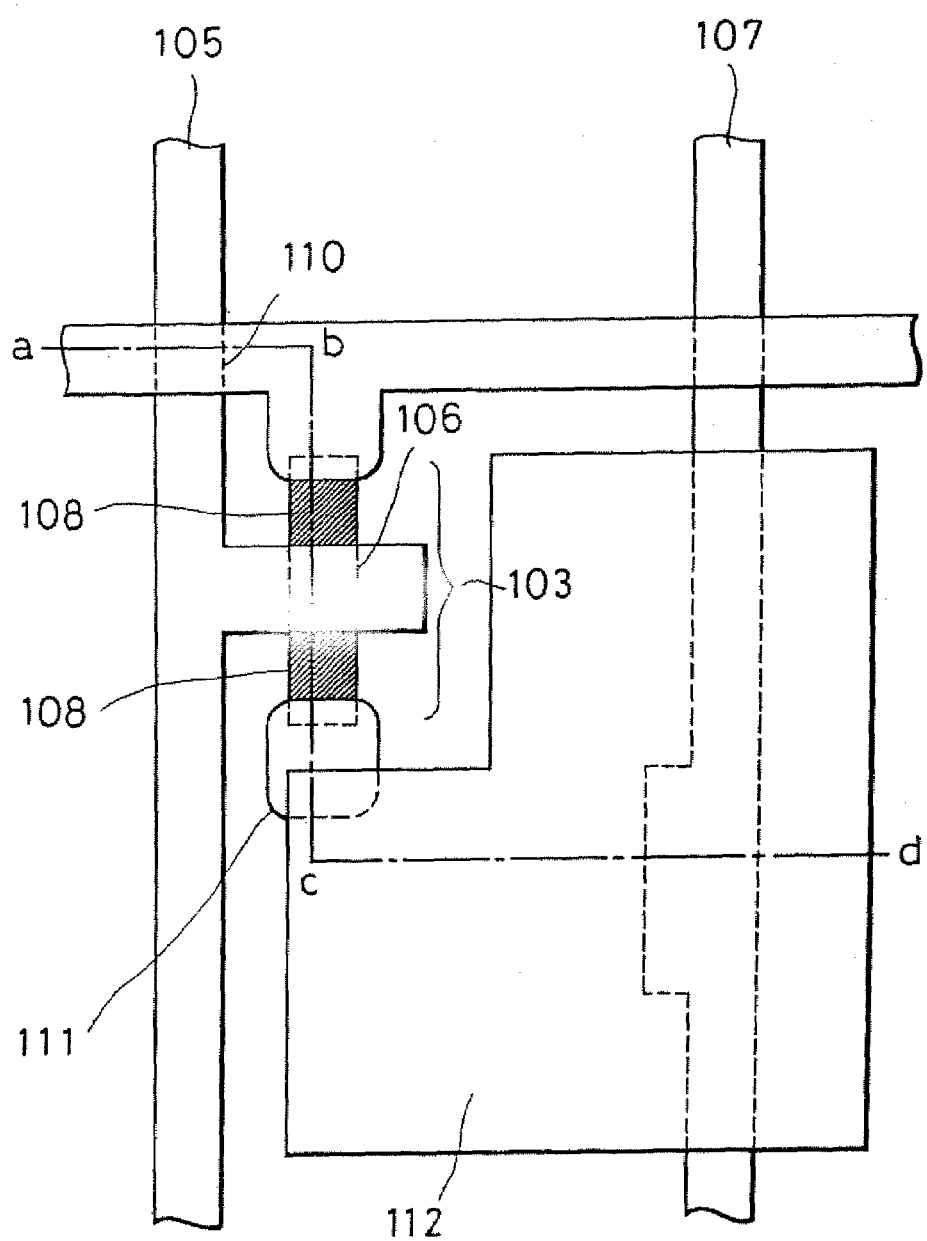
FIG. 2 is a diagram illustrating one pixel of a liquid crystal display fabricated in accordance with the present invention.

Thereafter, as shown in FIG. 1(E), a coating of a transparent conductive material such as tin indium oxide or tin oxide is formed by sputtering. This coating is patterned to form the pixel electrodes of a liquid crystal display. In this way, pixels of the liquid crystal display are fabricated. The number of the masks needed up to this step is four. FIG. 2 shows one of the pixels of the liquid crystal display fabricated in this way, as viewed from above. In this figure, the dot-and-dash line a-b-c-d corresponds to the line a-b-c-d of FIG. 1(E). FIG. 1 schematically shows the cross sections at these points.

As can be seen from FIG. 1(E), the ends of the doped regions 108 of the thin-film transistors do not agree with the ends of the gate electrode. The gate electrode is shown not to overlap the doped regions. The distance, or the offset L, between the gate electrode and each doped region is 0.2 to 0.5 µm. This forms one feature of the present invention. More specifically, in the example of FIG. 1, dopant atoms are implanted by a self-aligned, process to form doped regions. Then, the surface of the gate electrode is oxidized. The surface of the gate electrode recedes in this oxidation step. Accordingly, the laminate is in offset condition. This increases the ratio of the drain current flowing in ON condition to the drain current in OFF condition. Also, increases in the leakage current which would have been often encountered when a gate voltage of opposite polarity is applied can be suppressed.

In the example of FIG. 1, the gate electrode has an offset relation to the doped regions. In accordance with the present invention, the offset distance L can be set to any desired value. Also, the gate electrode can be made to overlap the doped regions. Where ion implantation is used to inject dopant atoms, the degree of secondary scattering of the injected ions can be adjusted by the energy of the ions. The secondary scattering of the ions causes the dopant ions to sink under the gate electrode. That is, if the degree of the secondary scattering is larger, then the gate electrode overlaps the doped region to a large extent. If the energy of the ions is reduced to suppress the secondary scattering, then the overlap is suppressed.

In accordance with the present invention, the gate electrode is subsequently oxidized, whereby the gate electrode recedes. The degree of the recession is determined by the degree of oxidation. Hence, the offset condition and the overlap condition can be realized to desired extent by controlling the energy of the implanted ions and the oxidizing conditions.

Storage capacitive electrode and interconnection 107 are shown. These electrode and interconnection are on the opposite side of their oxide films from a transparent pixel electrode 112. The electrode and interconnection 107 are maintained at the same potential as a counter electrode formed on the opposite side of a liquid crystal. As a result, a capacitance parallel to the capacitances of the liquid crystal pixels is formed. This capacitance reduces variations in the potential on the liquid crystal pixels when the gate signal is turned on and off where the parasitic capacitance between the gate and the source of each thin-film transistor (TFT) is large. In the example of FIG. 1, an oxide of titanium, aluminum, or tantalum forms a dielectric substance. The dielectric constants of these materials are at least twice as large as silicon oxide that is a typical insulating or dielectric material. Therefore, the area of the storage capacitance can be reduced. That is, the area of the portion of the liquid crystal pixel which transmits light can be increased, i.e., the numerical aperture (aperture ratio) is increased. Notice that a liquid crystal display does not always needs such storage capacitance.

FIG. 3 shows another example of the invention. In the example of FIG. 1, the interlayer insulator is only the oxide film of the lower conductive interconnections. In this case, the thickness presents problems. Since such an oxide has a large dielectric constant, the capacitance between the conductive interconnections will be increased. In FIG. 3, the interlayer insulator consists of two layers, and the thickness is increased. Also, the average dielectric constant is reduced to decrease the capacitance between the conductive interconnections.

In the same way as in the example of FIG. 1, a passivation film 302 is formed on an insulating surface of a substrate 301. The substrate may comprise a monolithic integrated circuit comprising a silicon semiconductor. The insulating surface of a substrate may be a surface of a silicon oxide film provided on a silicon wafer. A semiconductor region 303 is formed, and then a gate oxide film 304 is formed. A gate interconnection (wiring) 305, a gate electrode 306, and a storage capacitive interconnection 307 are formed from the same material on the insulating surface. Thereafter, dopant atoms are implanted by a self-aligned ion implantation process to form doped regions 308. Prior to this ion implantation, it is desired to leave all the gate oxide film, unlike the example of FIG. 1. In this way, a laminate shown in FIG. 3(A) is obtained.

Then, as shown in FIG. 3(B), the surfaces (the upper surface and the side surface) of the gate interconnection (wiring) 305, the gate electrode 306, and the storage capacitive interconnection 307 are oxidized and covered with layers 309 comprising an oxide of the metal or metal silicide as need arises, in the same way as in the example of FIG. 1. Then, an interlayer insulator 313 is formed on the oxidized surface. A window 314 for a drain electrode and a window 315 for a source electrode are formed in the insulator 313. Also, a drain interconnection (wiring) 310 is formed on the layer 309 covering the gate wiring 305 and a source electrode 311 is formed. The resulting laminate is shown in FIG. 3(C). The drain interconnection (wiring) 310 is in contact with the interlayer insulating film 313 in FIG. 3(C).

Finally, as shown in FIG. 3(D), transparent conductive electrodes 312, or pixel electrodes, are formed. In this way, the pixels of the liquid crystal display are formed. In this example, the number of the masks used in the whole process is five in the same as in the conventional process. That is, the first mask is used to form the semiconductor region. The second mask is used to form the gate interconnections etc. The third mask is used to form windows in the interlayer insulating film. The fourth mask is used to form the drain interconnections etc. The fifth mask is used to form the pixel electrodes.

In the present invention, the portion at which the gate interconnection intersects the drain interconnection comprises two layers, i.e., the oxide layer of the gate interconnection and the layer of the interlayer insulator. Especially, oxides formed by anodic oxidation are dense and excellent in voltage-resistance and hence well suited for separation between layers. In the past, only one layer of interlayer insulator has been used and so the voltage-resistance has presented problems. Especially, at the intersections of conductive interconnections, steps exist. The interlayer insulator cannot fully cover the steps, permitting presence of cracks. As a result, a short circuit to the upper conductive interconnections often takes place. In the novel method, it is not necessary at all to take account of the defects due to such steps. This contributes greatly to an improvement in the production yield.

In the example described thus far, only thin-film transistors of one conductivity type are used. Of course, complementary MOS transistors can also be used. FIG. 4 shows an example of one pixel of a liquid crystal display using CMOS transistors. Where CMOS transistors are employed, one or two photolithography steps must be added to the fabrication of transistors of one conductivity type. FIG. 4 shows manufacturing steps needing 5 masks to fabricate one pixel.

First, a passivation film 402 is formed on an insulating substrate 401, in the same way as in the previous examples. Semiconductor regions 403a and 403b are formed in desired portions. Then, a gate-insulating film is formed. Metal interconnections 409 and gate electrodes 406a, 406b are formed from aluminum on the gate-insulating film.

The above-described interconnections and the electrodes are oxidized to an appropriate depth by anodic oxidation. Where they are made of aluminum, for example, their surfaces are coated with coatings 409 of aluminum oxide. If the gate-insulating film consists of silicon oxide, then the substrate is lightly etched with $\frac{1}{10}$ hydrogen fluoride solution to selectively etch the gate-insulating film. At this time, those portions of the silicon oxide which are located under the gate interconnection and the gate electrode coated with aluminum oxide are not etched away. Subsequently, dopant atoms are introduced into the semiconductor regions by a well-known method. The conductivity type of the dopant atoms is n-type, for example.

Figure 4A:
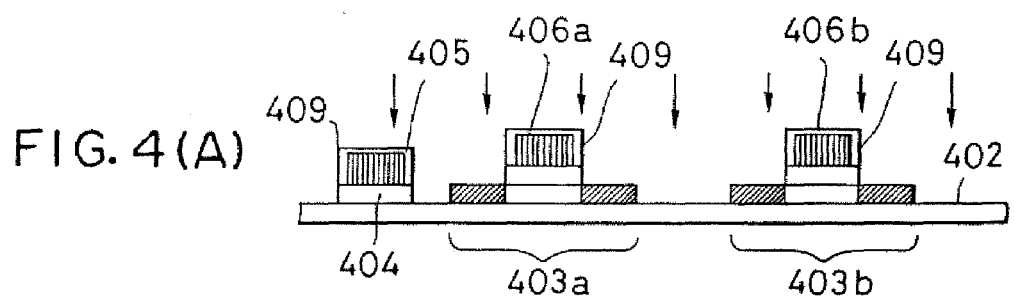
FIG. 4, (A)-(D), are cross-sectional views of further thin-film transistors according to the invention, for illustrating steps successively performed to fabricate the transistors.

Alternatively, the dopant atoms are implanted when the gate-insulating film remains after the oxidation of the gate interconnection and electrode. Then, the gate-insulating film is etched, using the aluminum oxide as a mask. As a result, a similar structure is obtained. This is shown in FIG. 4(A).

In the examples of FIGS. 1 and 3, dopant atoms are implanted prior to the oxidation of the surfaces of the conductive interconnections and of the electrodes. In the example of FIG. 1, the gate-insulating film is removed prior to the surface oxidation. Therefore, as typically shown in FIG. 1(C), mushroom portions of the aluminum oxide are left on the surfaces of the conductive interconnections and of the electrodes. If the thickness of the aluminum oxide is 500 nm, then protrusions as large as about 250 nm are produced. In the subsequent formation of the conductive interconnections, voids are created under the mushroom portions, causing breaking of the conductive interconnections. However, in the example of FIG. 4, less voids are created. Hence, the problem of the breaking of the interconnections is avoided.

Figure 4B:
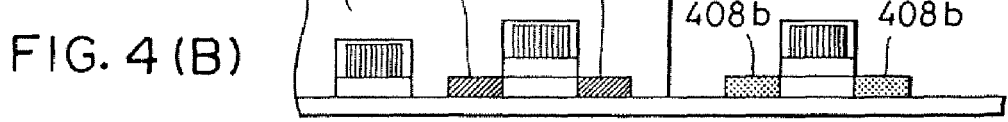

Then, the left semiconductor region 403a is coated with a material 407 such as a photomask. Under this condition, p-type dopant atoms are implanted. As a result, an n-type doped region 408a and a p-type doped region 408b are obtained. The resulting laminate is shown in FIG. 4(B).

Instead of these manufacturing steps, the following steps may be carried out. In a stage in which no dopant is added to the semiconductor regions, first, the semiconductor region 403b is coated with a photoresist or the like. An n-type dopant is implanted only into the semiconductor region 403a. Then, the semiconductor region 403a is coated. A p-type dopant is introduced only into the semiconductor region 403b. When this method is adopted, however, one more mask is needed compared with the method of FIG. 4.

Figure 4C:
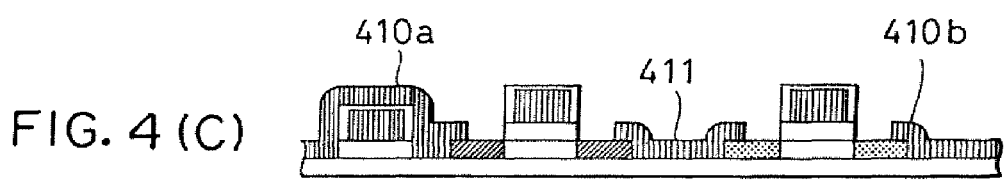
Figure 4D:
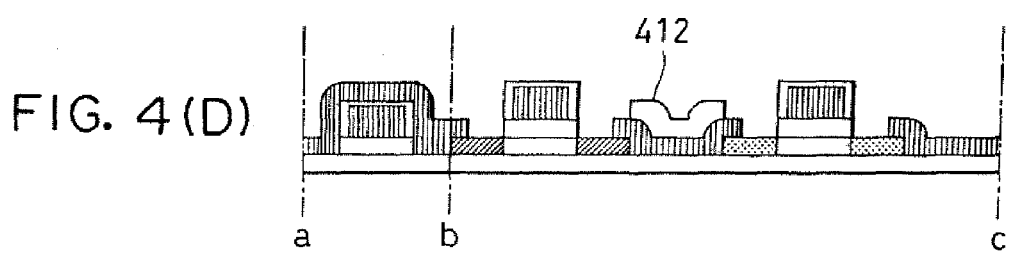

Subsequently, in the same way as in the example of FIG. 1, metal interconnections and electrodes 410a, 410b, 411 are formed, producing the structure of FIG. 4(C). Then, a pixel electrode 412 is formed. As a result, a structure shown in FIG. 4(D) is derived.

Figure 5:
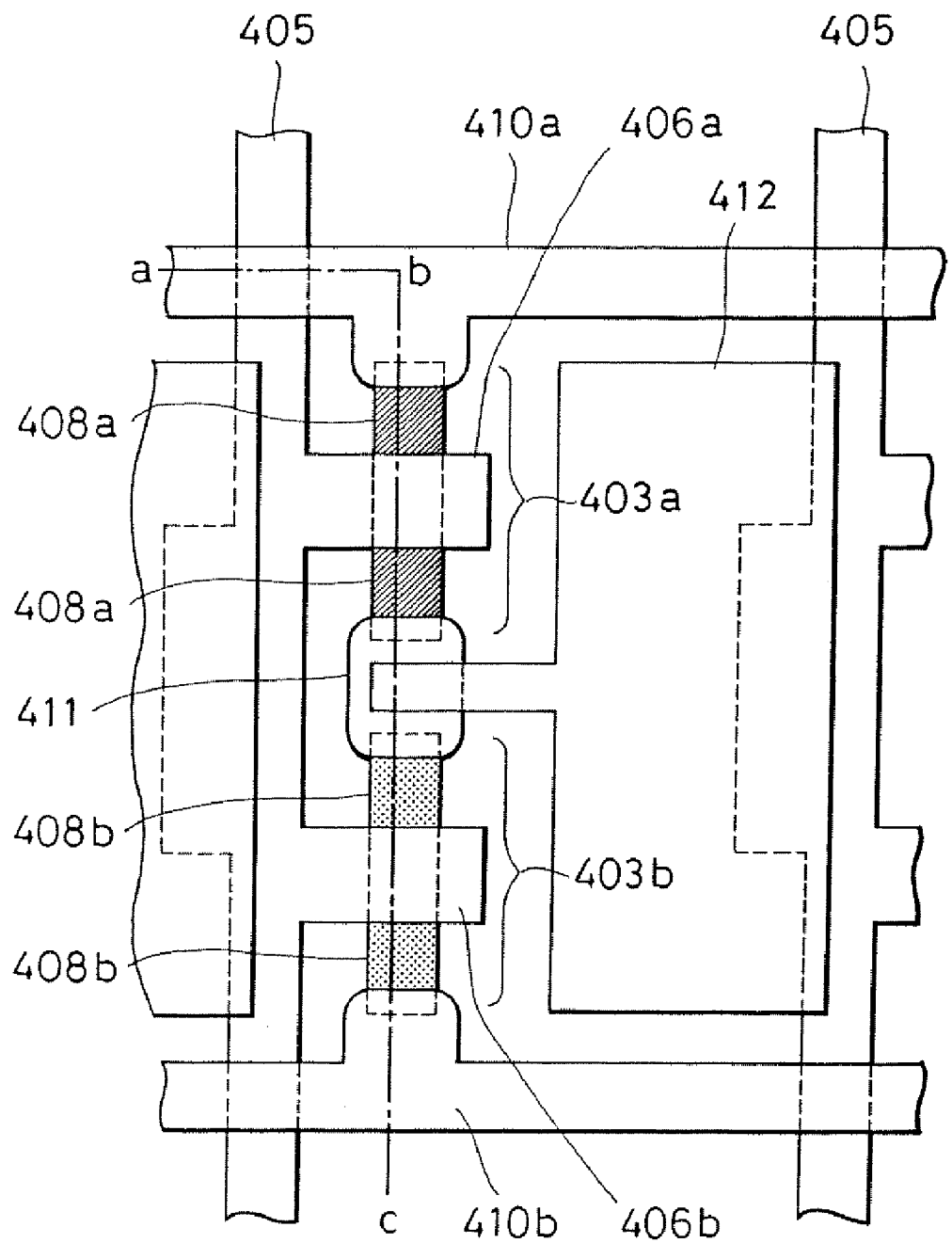
FIG. 5 is a diagram illustrating one pixel of another liquid crystal display according to the invention.
Figure 6A:
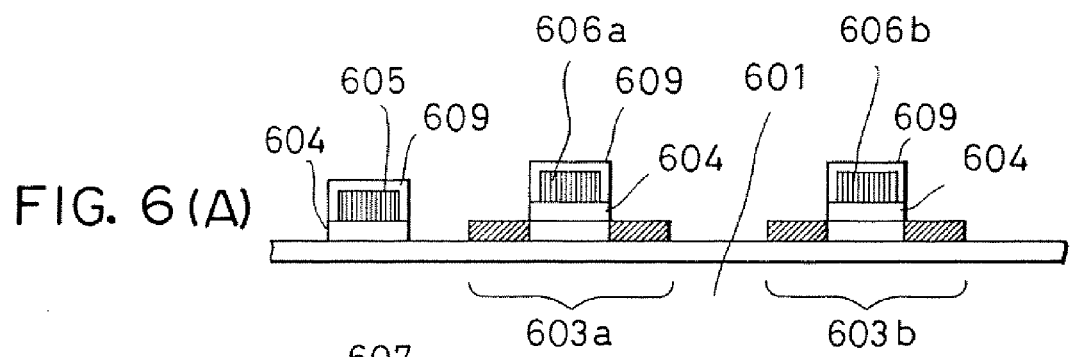
FIG. 6, (A)-(D), are cross-sectional views of yet other thin-film transistors according to the invention, for illustrating steps successively performed to fabricate the transistors.
Figure 6B:
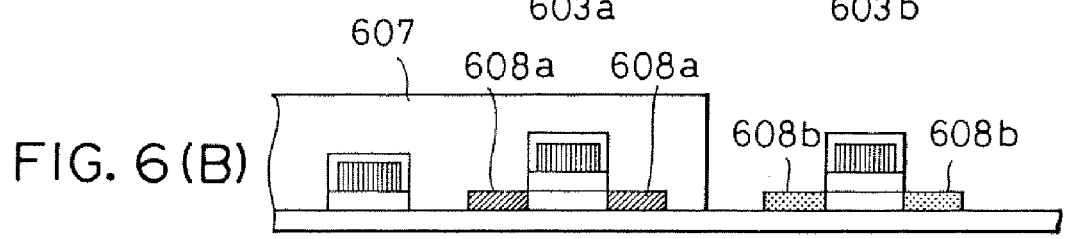
Figure 6C:
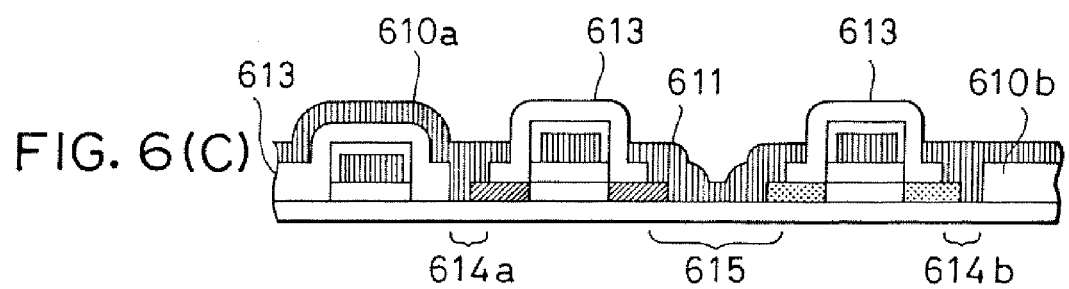
Figure 6D:
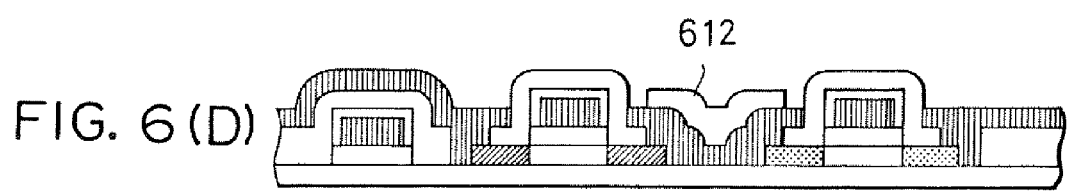

FIG. 5 is a top view of one pixel of the liquid crystal display fabricated by the steps described above. In this example, a part of the gate interconnection 405 or of an adjacent gate interconnection 405 sinks under the pixel electrode 412. A capacitance is formed between them. This capacitance functions similarly to the storage capacitance of FIG. 2. The dot-and-dash lines a, b, and c in FIG. 5 correspond to the dot-and-dash lines a, b, and c in FIG. 4(D). FIG. 4 shows cross-sections taken along the dot-and-dash lines.

In the examples described above, the CMOS devices take the inverter structure. Also, the CMOS devices can assume the buffer structure, the transfer gate structure described in Japanese Patent application Ser. Nos. 145642/1991, 145643/1991, 145566/1991, 157502/1991, 157503/1991, 157504/1991, 157505/1991, 157506/1991, and 157507/1991 filed by the present applicant and others or modifications of these structures.

The number of the masks used to produce this structure is five. The first mask is used to form the semiconductor region. The second mask is used to form the gate electrode and interconnection. The third mask is used to form the p-type doped regions. The fourth mask is used to form the second metal interconnections. The fifth mask is used to form the pixel electrode. Conventionally, 6 masks have been necessary. The first mask is used to form the semiconductor region. The second mask is used to form the gate electrode and interconnection. The third mask is used to form the p-type doped regions. The fourth mask is used to form windows in the interlayer insulator for the electrodes. The fifth mask is used to form the second metal interconnections. The sixth mask is used to form the pixel electrode.

FIG. 6 illustrates another novel method of fabricating a CMOS structure. This will be understood easily from the fabrication methods described previously in connection with FIGS. 3 and 5. In this example, if only the anodic oxide film 609 of the metal interconnection is considered to be insufficient for the thickness of the intersection of the first interconnection 605 and the second interconnection 610a and the capacitance between the interconnections is too large, then an interlayer insulator 613 is formed in addition to the anodic oxide film. In this case, 6 masks are required. The first mask is used to form the semiconductor regions 603a, 603b. The second mask is used to form the gate interconnection and electrodes 605, 606a, 606b. The third mask is used to form the photoresist layer 607. The fourth mask is used to form the windows 614*a*, 614*b*, 615 in the interlayer insulators for the electrodes. The fifth mask is used to form the second metal interconnection and electrodes 610*a*, 610*b*, 611. The sixth mask is used to form the pixel electrode 612. This number is the same as the minimum number of masks used in the conventional fabrication method. However, the same advantages as those obtained by the fabrication method illustrated in FIG. 3 are derived except for the CMOS structure. A high production yield can be accomplished.

FIG. 7 illustrates another example of the invention. In the examples of FIGS. 1, 3, 4, and 6, the thickness of the interlayer insulator between the lower interconnection and the upper interconnection is substantially equal to the thickness of the insulator between the storage capacitive interconnection and the pixel electrode. Increasing the former thickness is preferred, while decreasing the latter thickness is preferred. The method of FIG. 7 satisfies these conflicting requirements.

Figure 7A:
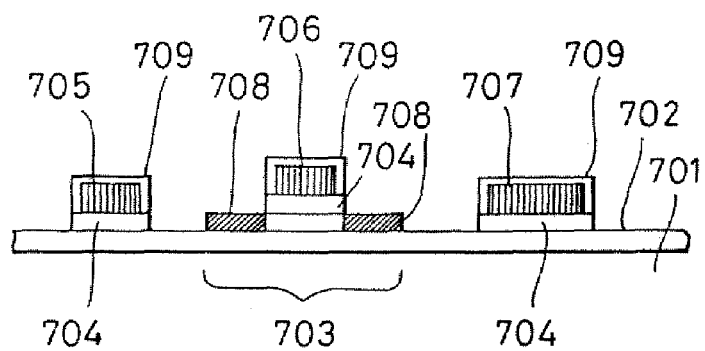
FIG. 7, (A)-(D), are cross-sectional views of yet further thin-film transistors according to the invention, for illustrating steps successively performed to fabricate the transistors.

In the same way as in the example of FIG. 1, a passivation film 702 is formed on an insulating substrate 701. Semiconductor regions 703 are formed, and then gate oxide films 704 are formed. Thereafter, a gate interconnection 705, a gate electrode 706, and a storage capacitive interconnection 707 are formed. The surfaces of these interconnections and electrodes are oxidized by anodic oxidation. Using the oxide film 709 as a mask, the gate-insulating film is removed. Then, dopant ions are implanted by a self-aligned ion implantation method while using the gate as a mask, thus forming doped regions 708. The gate-insulating film may also be left behind. In this way, a structure shown in FIG. 7(A) is obtained.

Figure 7B:
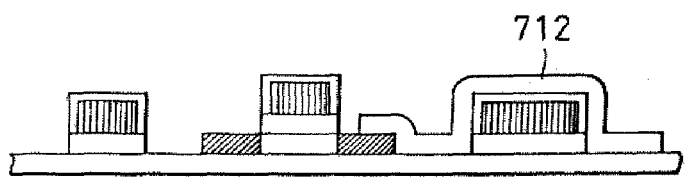
Figure 7C:
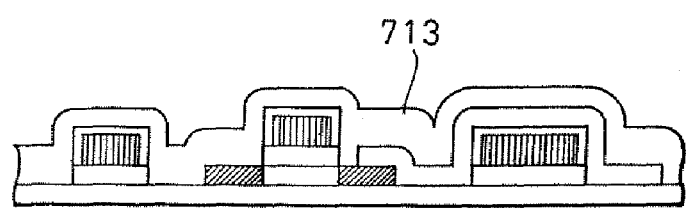
Figure 7D:
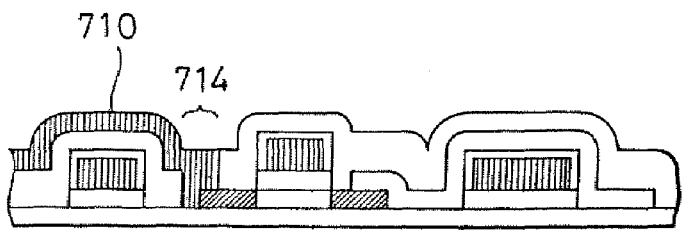

Then, as shown in FIG. 7(B), a pixel electrode 712 is formed. As shown in FIG. 7(C), an interlayer insulator 713 is formed. Windows 714 for source and drain electrodes, respectively, are formed in this interlayer insulator 713. A drain interconnection 710 is formed, resulting in a laminate shown in FIG. 7(D).

In the pixels of the liquid crystal display having such a structure, the interlayer insulator at the intersections of the conductive interconnections is thick, and the dielectric layer of the storage capacitive interconnection is thin. The number of the masks used for the manufacturing steps described thus far is five. The first mask is used to form the semiconductor regions. The second mask is used to form the gate interconnection and electrode. The third mask is used to form the pixel electrode. The fourth mask is used to form the windows in the interlayer insulator for the electrodes. The fifth mask is used to form the upper metal interconnection.

In this structure, the upper metal interconnection acting as the drain interconnection is located over the pixel electrode. As a result, when a counter electrode is formed, the electric field at the drain interconnection is stronger, while the electric field at the pixel electrode is weaker. In normal operation, a signal is kept applied to the drain interconnection. Therefore, even if the area occupied by the drain interconnection is small, a constantly bright or dark condition is created irrespective of the image because a high voltage is applied to the drain interconnection. Consequently, the image is affected greatly. Furthermore, since the signal transmitted over this drain interconnection contains information about other pixels, a phenomenon similar to crosstalk occurs. Accordingly, sufficient attention must be paid to this point in adopting the structure of FIG. 7. For example, the TFT (thin-film transistor) panel is mounted on the front side, or other contrivance is needed. Since the drain interconnection is always in the shadow and invisible, the signal applied to the drain interconnection does not affect the visual sense.

In the examples of FIGS. 1 and 3, the storage capacitive interconnection exists under the pixel electrode and, therefore, the pixel electrode is not flat. This makes nonuniform the strength of the electric field inside the same pixel electrode. Also, the interconnections quite slightly differ in width. For these reasons, the brightness may differ among pixels. In this way, to obtain pixels having more uniform properties, it is desired to make the pixel electrode flat and to make the pixels have the same height. A method illustrated in FIG. 8 fulfills these requirements.

Figure 8A:
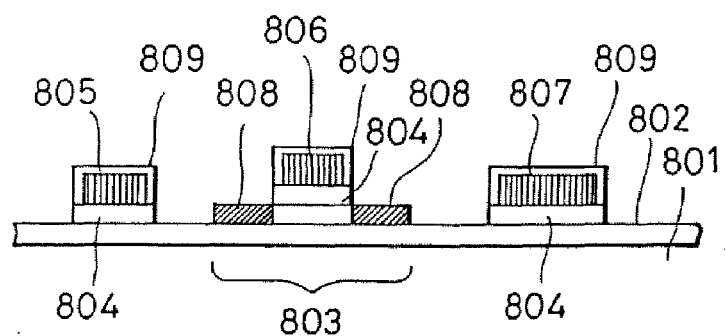
FIG. 8, (A)-(D), are cross-sectional views of still other thin-film transistors, for illustrating steps successively performed to fabricate the transistors.

In the same way as in the examples of FIGS. 1 and 7, a passivation film 802 is formed on an insulating substrate 801. Semiconductor regions 803 are formed, and then gate oxide films 804 are formed. Thereafter, a gate interconnection 805, a gate electrode 806, and a storage capacitive interconnection 807 are formed. The surfaces of these interconnections and electrodes are oxidized by anodic oxidation. Using the oxide film 809 as a mask, the gate-insulating film is removed. Then, dopant ions are implanted by a self-aligned ion implantation method while using the gate as a mask, thus forming doped regions 808. The gate-insulating film may also be left behind. In this way, a structure shown in FIG. 8(A) is obtained.

Figure 8B:
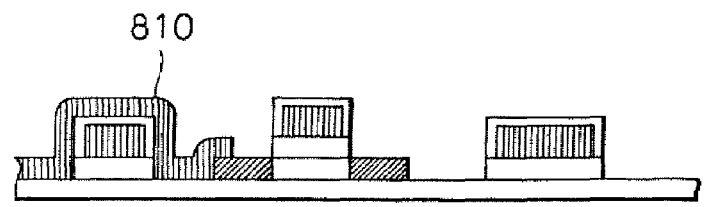
Figure 8C:
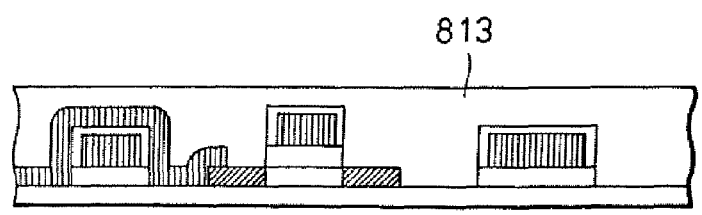
Figure 8D:
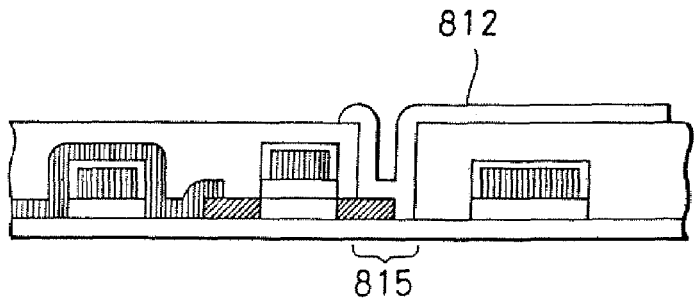

Then, as shown in FIG. 8(B), a drain interconnection 810 is formed. A flat coating 813 is formed from an organic material such as polyimide, as shown in FIG. 8(C). Finally, a window 815 for the source electrode and a pixel electrode 812 are formed. The resulting structure is shown in FIG. 8(D).

The number of the masks used for the steps described thus far is five. The first mask is used to form the semiconductor regions. The second mask is used to form the gate interconnection and electrode. The third mask is used to form the upper metal interconnection. The fourth mask is used to form the window in the interlayer insulator for the electrode. The fifth mask is used to form the pixel electrode. In this manner, the present invention permits fabrication of semiconductor devices suited for quite various purposes.

In accordance with the present invention, anodic oxidation can be used as a means for oxidizing the metal interconnection. In this anodic oxidation, a voltage of 50 to 200 V or more may be applied between the anode and the cathode within an electrolytic solution. Sometimes, a large potential gradient exceeding 10 MV/cm is produced around the metal interconnection and the electrode which are being oxidized by anodic oxidation. Therefore, the gate-insulating film must be protected against such a high voltage. For this purpose, it is desired that the semiconductor regions be at the same potential as the gate interconnection and electrode.

Figure 9A:
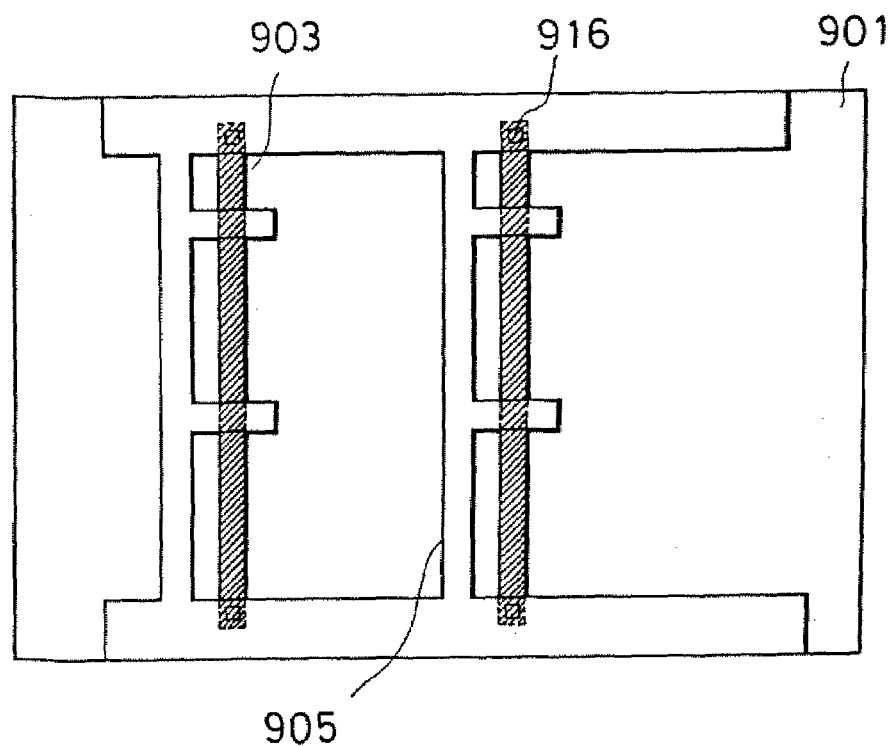
FIG. 9, (A) and (B), are diagrams illustrating steps successively performed to fabricate a liquid crystal display according to the invention.
Figure 9B:
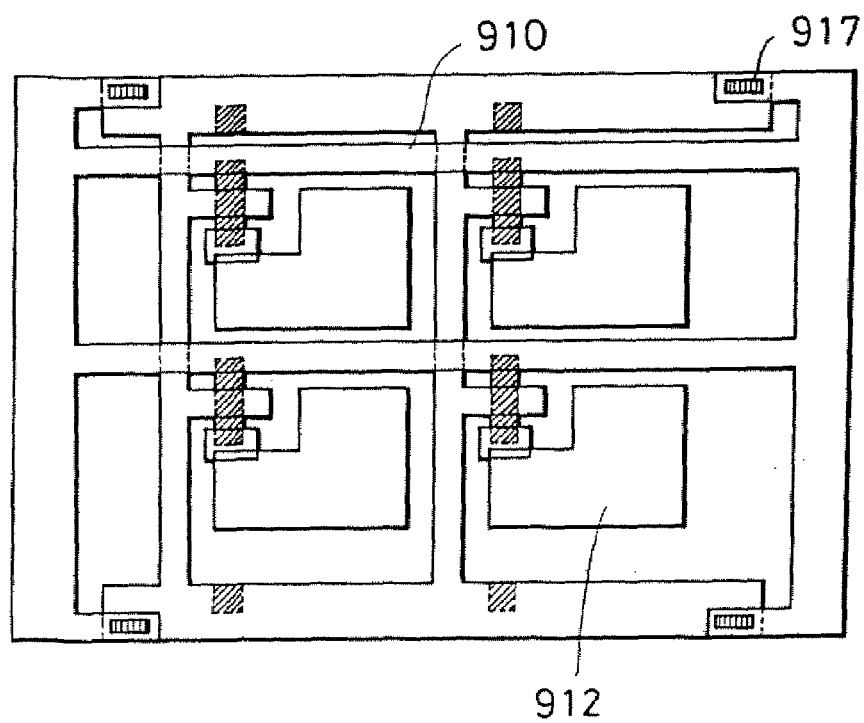

FIG. 9 illustrates a method of performing this purpose. First, stripe-shaped semiconductor regions 903 are formed on an insulating substrate 901. A gate-insulating film is formed on the semiconductor regions. Windows 916 are formed in the gate-insulating film at the ends of the semiconductor regions. Gate interconnections and gate electrodes 905 are formed. That is, the semiconductor regions 903 are retained at the same potential as the gate interconnections and the gate electrodes 905 via the windows 916. Then, the surfaces are oxidized by anodic oxidation. Substantially no electric field is produced between the semiconductor regions and the gate interconnections/electrodes. Therefore, it is unlikely that an excessive voltage is applied to the gate-insulating film, thus destroying the film. This condition is shown in FIG. 9(A).

After the end of the anodic oxidation, dopant atoms are implanted. The stripe-shaped semiconductor regions are cut into appropriate lengths. Windows 917 are formed in the oxide films formed on the gate interconnections. Then, drain interconnections and drain electrodes 910 are formed. Under this condition, the gate interconnections 905 are maintained at the same potential as the drain interconnections 910. As a result, dielectric breakdown at the intersections of the gate interconnections and the drain interconnections due to static electricity produced during a work is prevented. It is to be noted that this manufacturing step has no relation to the high voltage applied during the anodic oxidation. Subsequently, pixel electrodes 912 are formed, followed by removal of the surrounding metal interconnections.

In the process described above, a lithography step is needed to form windows for connecting the conductive interconnections. The accuracy of this step is far below the accuracy of the step for forming pixels. Therefore, the addition of this lithography step hardly lowers the production yield. Only the surface oxide films can be evaporated by laser. In this case, the manufacturing step is simplified greatly.

The number of the masks used in the method of FIG. 9 is seven. That is, the first mask is used to form the stripe-shaped semiconductor regions. The second mask is used to form the windows in the gate-insulating film. The third mask is used to form the gate interconnections and the gate electrodes. The fourth mask is used to cut the stripe-shaped semiconductor regions. The fifth mask is used to form the windows in the oxide films. The sixth mask is used to form the drain interconnections and the drain electrodes. The seventh mask is used to form the pixel electrodes. In this way, more masks are needed than the process of FIG. 1 for producing the same structure. As described previously, the second and fifth masks do not require high accuracy. It substantially follows that five masks are needed. That is, one more mask is required than the method of FIG. 1.

EXAMPLE 1

Example 1 of the present invention is now described by referring to FIG. 10. The invention is applied to CMOS TFTs fabricated on an AN glass substrate. First, as shown in FIG. 10(A), a silicon nitride film 152*a* was formed to a thickness of 100 nm on the AN glass substrate 151 by low-pressure CVD. Dichlorosilane ($SiH_2Cl_2$) and ammonia were used as raw material gases in the low-pressure CVD. The pressure was 10 to 1000 Pa. The temperature was 500-800° C., preferably between 550 and 750° C. Of course, silane ($SiH_4$) or trichlorosilane ($SiHCl_3$) may also be used. Instead of the low-pressure CVD, other CVD techniques such as plasma CVD, photo-assisted CVD, or plasma-enhanced CVD may be exploited.

The silicon nitride film formed in this way prevents the moving ions such as sodium ions contained in the glass substrate from entering the semiconductor. Therefore, if the amount of the moving ions in the substrate is sufficiently small, then it is not necessary to form the silicon nitride film. This silicon nitride film can be replaced by an aluminum oxide film. To form the aluminum oxide film, trimethylaluminum ($Al(CH_3)_3$) and an oxidizing gas such as oxygen or dinitrogen monoxide ($N_2O$) are used in the aforementioned low-pressure CVD. Similar materials may be used where other CVD techniques are utilized. Also, this silicon nitride film can be formed by sputtering.

In the figure, the silicon nitride film is formed only on the surface of the glass substrate on which devices are formed. Preferably, the whole glass substrate is enclosed in the silicon nitride film, for the following reason. In the subsequent anodic oxidation step, the substrate is immersed in a solution. If the glass substrate has bare portions, then alkali ions may dissolve in the solution from these bare portions and adhere to or enter the semiconductor regions.

Then, a silicon oxide film 152*b* having a thickness of 70 nm was formed. ECR plasma CVD or sputtering was well suited for this formation. A semiconductor region was to be formed on this silicon oxide film. If numerous interface levels and numerous trap centers are produced at the interface between the silicon oxide film and the semiconductor region, then the conductivity of the semiconductor region cannot be controlled. This deteriorates the transistor characteristics. Therefore, sufficient care must be paid to the formation of the silicon oxide film. It is to be noted that silicon nitride cannot be used instead of silicon oxide, because silicon nitride films themselves often trap carriers.

Our research has revealed that a silicon oxide film formed by ECR plasma CVD or sputtering has a small density of interface levels and, therefore, is well suited for the present purpose. Especially, where the silicon oxide film was formed by sputtering, when a bulk of silicon oxide was used as a target, the ambient was a mixture of oxygen and argon, and the oxygen content was 50-100%, a coating having very good characteristics was formed. Where the film is created by ECR plasma CVD, silane ($SiH_4$) and oxygen should be used. The density of the interface levels between the silicon oxide film formed in this way and the subsequently formed semiconductor coating, or the silicon film, was approximately $\sim 10^{11}$ $cm^{-2}$, which is a quite excellent density. When the coating is formed by sputtering or ECR plasma CVD, if 1-5% hydrogen chloride, hydrogen fluoride, or the like is added to the ambient, or if 1-10% silane containing chlorine or fluorine such as dichlorosilane or silicon tetrafluoride ($SiF_4$) is added, then chlorine or fluorine is introduced in the silicon oxide coating. The introduced atoms are strongly bonded to silicon atoms, thereby terminating the unpaired sites (dangling bonds) of silicon-oxygen bonds. This further decreases the interface levels, for example, down to 5 to $9 \times 10^{10}$ $cm^{-2}$.

Then, a silicon coating having a thickness of 30 nm was formed by low-pressure CVD. Silane exceeding 6N such as $SiH_4$, $Si_2H_6$, or $Si_3H_8$ was employed as a silicon source. The coating was not doped with dopants. However, where CMOS devices are fabricated, if it is required that the NMOS and the PMOS be substantially equal in threshold voltage value, then a trace amount of diborane ($B_2H_6$) may be added to the raw material gases so that boron may be contained at a density of $10^{15}$ to $10^{16}$ $cm^{-3}$. Alternatively, dopant ions such as $BF_2^+$ are implanted into the silicon film after it is formed.

These three films were formed by a multi-chamber film formation apparatus capable of forming films continuously without exposing the substrate to the atmosphere. Especially, a continuous film formation system capable of protecting the interface from contaminants is indispensable for thin-film transistors, since the characteristics of the interfaces of semiconductors are important.

Then, the silicon coating is photolithographically patterned by a well-known method to form a p-channel TFT region 153*a* and an n-channel TFT region 153*b*. The laminate was annealed at 600° C. for 24 to 72 hours in hydrogen atmosphere to crystallize the TFT regions. A silicon oxide film 154 becoming a gate-insulating film was formed by the aforementioned sputtering or ECR plasma CVD. Similarly to the above-described silicon oxide coating 152*b*, the characteristics of the interfaces of this silicon oxide coating with the semiconductor regions are of importance and, therefore, this coating must be fabricated very carefully. The thickness of this silicon oxide coating was 100 nm.

Figure 10A:
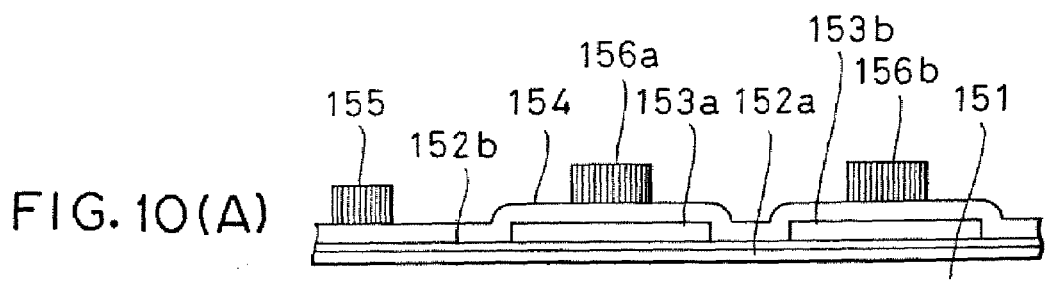
FIG. 10, (A)-(D), are cross-sectional views of still further thin-film transistors according to the invention, for illustrating steps successively performed to fabricate the transistors.

Thereafter, an aluminum coating having a thickness of 0.8 to 1.0 μm was formed by electron-beam evaporation. This coating can also be formed by sputtering or metallo-organic CVD. Other aluminum coating was photolithographically patterned by a well-known method to form gate electrodes 156*a*, 156*b*, and: gate interconnections (wirings) 155. In this way, a laminate as shown in FIG. 10(A) was obtained. The width of the gate electrodes was 10 µm.

Then, the surfaces of the gate electrodes and of the gate interconnections were oxidized by anodic oxidation to form aluminum oxide coatings having a thickness of 0.3 to 0.5 µm. The anodic oxidation was performed in the sequence described now. It is to be noted that the numerical values given in the following description merely constitute examples. The optimum values are determined according to the size and other factors of the fabricated devices. That is, the numerical values given in the following description never delineate the scope of the present invention. First, ethylene glycol solution of tartaric acid having a sufficiently small alkali ion concentration was prepared. The concentration of the tartaric acid was 0.1 to 10%, e.g., 3%. Then, 1-20%, e.g., 10%, aqueous ammonia was added to the tartaric acid to adjust the pH to 7±0.5.

Figure 10B:
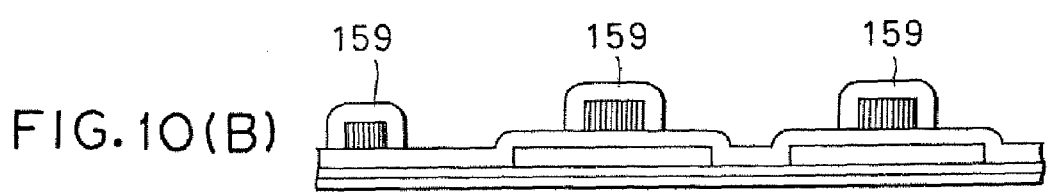

A platinum electrode was placed as a cathode within this solution. The whole laminate was immersed in the solution. The gate interconnections and the gate electrodes on the substrate were connected with the positive terminal of a DC power supply. At first, a constant electrical current of 2 mA was supplied. The voltage between the anode and the cathode, or the platinum electrode, varied with time and with the concentration of the solution and depending on the thickness of the oxide films formed on the gate electrodes and on the gate interconnections. Generally, as the thickness of the oxide films increases, a higher voltage is required. In this way, the current was kept supplied. The voltage was kept constant when it reached 150 V. The current was kept supplied until it reached 0.1 mA. The constant current condition persisted for about 50 minutes. The constant voltage condition persisted for about 2 hours. Aluminum oxide films 159 having a thickness of 0.3 to 0.5 µm was formed on the surfaces of the gate electrodes and of the gate interconnections. The formed aluminum oxide films were sufficiently dense without any treatment. To increase the electrical insulation, the laminate was immersed in hot water for 10 minutes. Coatings resistant to high voltages of 6 to 12 MV/cm were formed by this step. This condition is shown in FIG. 10(B).

Then, the laminate was immersed in a solution of hydrofluoric acid, e.g., 1/10 hydrofluoric acid to etch the silicon oxide film 154, thus exposing the surfaces of the semiconductor regions. Since aluminum oxide was insoluble to hydrofluoric acid, those portions of the silicon oxide film which were located under the gate electrodes and the gate interconnections were not etched away. The silicon oxide 154 is left under the gate interconnection (wiring) 155 and the gate electrodes 156*a* and 156*b*. The left silicon oxide film under the gate interconnection (wiring) 155 comprises the same material as the left silicon oxide films under the gate electrodes 156*a* and 156*b* and is provided between the substrate (the insulating surface of the substrate) and the gate interconnection (wiring) 155. However, if the laminate is left within hydrofluoric acid for a long time, even these portions of the silicon oxide film under the gate electrodes and the gate interconnections will be dissolved away.

Subsequently, ions of boron or a boronic compound such as $BF_2^+$ were implanted at a density of $10^{18}$ atoms/cm$^3$ by a well-known ion implantation method. At this time, the implanted ions did not enter the portions of the semiconductor regions located under the gate electrodes except for ions subjected to secondary scattering. That is, doped regions could be formed by a self-aligned process. In this way, p-type doped regions 158*a* were formed.

Figure 10C:
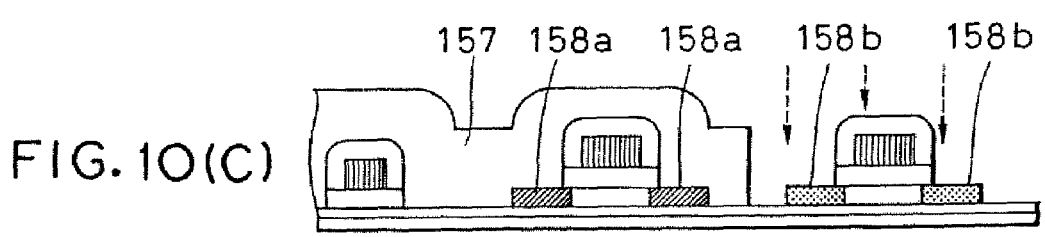

Then, as shown in FIG. 10(C), the semiconductor region 153*a* was coated with photoresist 157; only the semiconductor region 153*b* was exposed. Under this condition, phosphorus ions were implanted at a density of $10^{20}$ atoms/cm$^3$. Boron ions had already existed in the semiconductor region 153*b* but the phosphorus ions surpassed the boron ions in density. Therefore, the semiconductor region was doped n-type, resulting in an n-type doped region 158*b*. In this way, dopant ions could be lodged into the semiconductor region. In this doped region, the crystal was destroyed because of the bombardment of the ion implantation. Hence, the doped region assumed an amorphous condition, consisted of microcrystals, or took on a mixed condition of these two conditions. Since any appropriate word describing this condition is not found, this is herein referred to as the amorphous condition.

Then, the photoresist was removed. Laser radiation was illuminated from a laser such as an excimer laser or argon ion laser located above the laminate to anneal it. Where a KrF excimer laser emitting laser pulses having a wavelength of 248 nm and a pulse duration of 10 nsec was used, if 10 shots of laser radiation having an energy density of 150 to 250 mJ/cm$^2$, e.g., 210 mJ/cm$^2$ were emitted, then crystallization could be realized almost with certainty. If the number of the shots is less than this value, the crystallization is not uniform because of uncontrollable fluctuations and variations in the output of the laser. In this laser annealing, the portions located under the gate electrodes are not illuminated with the laser radiation and so these portions cannot be crystallized. However, if the semiconductor region is thick, the laser radiation reaches the region of the geometrical shadow of the laminate because of the diffraction of the radiation, whereby the crystallization progresses. The extent of the diffraction of the laser radiation is about half of the wavelength of the laser radiation where the thickness of the semiconductor region is larger than the wavelength of the laser radiation. The extent of the diffraction is approximately equal to the thickness of the semiconductor regions where the thickness of the semiconductor region is less than the wavelength of the laser radiation. In the present example, the thickness of the semiconductor regions is 30 nm, which is much smaller than the wavelength of 248 nm of the laser radiation. In this case, the extent of the diffraction is sufficiently smaller than the width of 10 µm of the gate electrodes. Therefore, if an amorphous region was created by the ion implantation, some of this region cannot be recrystallized by the laser annealing. The meaning of these portions will be described later.

In this way, the CMOS TFT structure could be roughly fabricated. It is only necessary to form metal interconnections on these TFTs. Unlike the prior art TFTs, it is not necessary to form windows for the source and drain electrodes. Consequently, it is quite easy to form these metal interconnections. More specifically, since the semiconductor regions have been already exposed, ohmic contact can be made simply by forming a film of aluminum or other metal on the bare portions. Accordingly, for example, an aluminum film or a multilayer film of aluminum and chromium 163 is formed on the whole surface, as shown in FIG. 10, and then unwanted portions are etched away photolithographically by a well-known method to form second conductive interconnections (wirings) 160*a*, 160*b*, and 161. The interconnection (wiring) 160*a* is a drain wiring connected with a drain region 158*a* provided in the semiconductor region 153*a*. The interconnection (wiring) 160*a* is in contact with the layer 159 covering the gate interconnection (wiring) 155 (the oxidized surface 159 on the gate interconnection 155).

Figure 10D:
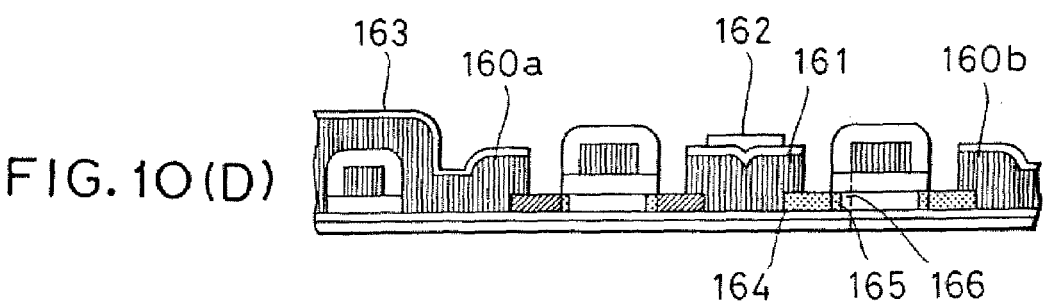

In the case of a device which does not require a high accuracy, these interconnections are directly formed by vacuum evaporation or other method, using a metal mask. Then, as shown in FIG. 10(D), a coating 162 for the pixel electrodes of a liquid crystal display is formed in desired portions, thus forming liquid crystal pixels.

The number of the masks used for the manufacturing steps described thus far is five. That is, the first mask was used to form the semiconductor regions 153a and 153b. The second mask was used to form the gate electrodes and the gate interconnections. The third mask was used to form the layer of photoresist 157. The fourth mask was used to form the second conductive interconnections. The fifth mask was used to form the pixel electrodes. The present TFTs have the offset regions produced by the geometrical misalignment between the gate electrodes and the doped regions, in addition to normal doped regions 164. Amorphous, doped regions 165 exist between these two kinds of doped regions. The advantages of the formation of the amorphous regions are described in detail in a Japanese patent application invented by the present inventors et al., filed Aug. 26, 1991, assigned to the Semiconductor Energy Laboratory Co., Ltd., Japan, and entitled "Insulated-Gate Semiconductor Device and Method of Fabricating Same". Therefore, the advantages are not described herein.

A film of polyimide was formed on the laminate (hereinafter referred to as the first laminate) fabricated by these steps. The surface of the polyimide film was rubbed with cotton cloth. A transparent electrode of ITO (indium tin oxide) was formed on another laminate (hereinafter referred to as the second laminate). A polyimide film was formed on the ITO electrode. The surface of the polyimide film was rubbed with cotton cloth. The first and second laminates were stuck together such that the direction of rubbing on the first laminate was parallel to the direction of rubbing on the second laminate. Then, a nematic liquid crystal was injected between the first and second laminates. Thereafter, a Nicol prism having a pair of polarizing plates whose planes of polarization were perpendicular to each other was stuck to the outside of each laminate. In this way, a non-twisted nematic liquid crystal electro-optical device was completed. The Nicol prisms were stuck in such a way that the direction of axis of absorption of the pair of polarizing plates made an angle of 45 degrees to the direction of rubbing of the first and second laminates.

This non-twisted nematic liquid-crystal electro-optical device displays white when it is OFF because of birefringence. When the device is ON, the nematic liquid crystal stands on the laminates and displays black.

It is to be understood that the present invention is not limited to the above-described non-twisted nematic liquid crystal electro-optical device and that the invention can be applied also to other liquid crystal electro-optical devices. For example, the invention can be applied to antiferroelectric liquid crystal electro-optical devices.

In accordance with the present invention, TFTs can be fabricated with less masks than conventional. Also, more reliable TFTs could be fabricated by the novel method with the same number of masks as are used in the prior art techniques. One object of the invention is to improve the production yield with which TFTs are fabricated. Especially, formation of the source and drain electrodes of TFTs is a sophisticated work requiring accuracy better than 1 μm. This manufacturing step produced much more defective panels than other steps.

The number of substandard products increases as the number of TFTs packed on a panel increases and as the area of the panel increases, because formation of windows for the electrodes and formation of electrode interconnections require quite advanced techniques. The present invention dispenses with the formation of the windows for the electrodes and so the production yield chiefly depends on the formation of the electrode interconnections. Let us assume that the percentages of substandard products produced in the step of the formation of the windows and in the step of the formation of the electrode interconnections are both 20%. If these two steps are conducted, only 64% of the completed products are accepted. In accordance with the present invention, the step of forming the windows is dispensed with and, therefore, 80% of the products are accepted.

In liquid crystal displays, the occurrence of defective products due to short circuit of the gate interconnections to the signal lines such as source and drain interconnections has posed serious problems. This is directly caused by problems with handling but can be considered to be induced by defective interlayer insulator. In particular, interlayer insulator consisting of silicon oxide cannot fully cover the undulations of the conductive interconnections, making the thickness nonuniform. Especially, the film is thin on the side surfaces of the gate interconnections which are lower interconnections. On the other hand, a sufficiently thick film is formed on the upper surfaces of the lower interconnections. Under this condition, if upper interconnections are formed, a short circuit often takes place also on the side surfaces of the lower interconnections. In accordance with the present invention, however, an insulating film having a substantially uniform thickness on the side surfaces and on the upper surfaces of the lower interconnections can be formed by anodic oxidation. Consequently, the above-described problems are solved. If the conventional interlayer insulating film is formed after the formation of this insulating oxide film, then the electrical insulation is enhanced further.

What is claimed is:

1. A semiconductor device comprising:
a glass substrate;
a silicon oxide film on the glass substrate;
a thin film transistor including a semiconductor layer comprising crystalline silicon on the silicon oxide film;
a gate wiring electrically connected to a gate electrode of the thin film transistor, the gate wiring comprising aluminum;
a second wiring intersecting the gate wiring and electrically connected to the thin film transistor;
a storage capacitive wiring which extends in parallel with the gate wiring wherein the storage capacitive wiring is formed on a same insulating film as the gate wiring;
an organic layer formed over the storage capacitive wiring; and
a pixel electrode formed over the organic layer,
wherein the storage capacitive wiring has at least first and second portions formed of a same material, the first portion extending under the pixel electrode and having a first width, and the second portion extending across the second wiring and having a second width narrower than the first width, and
wherein the same material is selected from the group consisting of tantalum and titanium.

2. The semiconductor device according to claim 1, wherein the semiconductor device is a liquid crystal display device.

3. The semiconductor device according to claim 1, wherein a surface of the gate wiring is provided with an oxide film which is formed by anodic oxidation.

4. The semiconductor device according to claim 1, wherein the thin film transistor has a polycrystalline silicon layer.

5. The semiconductor device according to claim 1, wherein the thin film transistor has a top-gate structure.

6. The semiconductor device according to claim 1, wherein the pixel electrode is in direct contact with a top surface and a side surface of an impurity doped region of the semiconductor layer.

7. A semiconductor device comprising:
a glass substrate;
a silicon oxide film on the glass substrate;
a thin film transistor including a semiconductor layer comprising crystalline silicon on the silicon oxide film;
a gate wiring electrically connected to a gate electrode of the thin film transistor, the gate wiring comprising aluminum;
a second wiring intersecting the gate wiring and electrically connected to the thin film transistor;
a storage capacitive wiring which extends in parallel with the gate wiring wherein the storage capacitive wiring is formed on a same insulating film as the gate wiring;
an organic layer formed over the storage capacitive wiring and the thin film transistor; and
a pixel electrode formed over the organic layer,
wherein the storage capacitive wiring has at least first and second portions formed of a same material, the first portion extending under the pixel electrode and having a first width, and the second portion extending across the second wiring and having a second width narrower than the first width, and
wherein the same material is selected from the group consisting of tantalum and titanium.

8. The semiconductor device according to claim 7, wherein the semiconductor device is a liquid crystal display device.

9. The semiconductor device according to claim 7, wherein a surface of the gate wiring is provided with an oxide film which is formed by anodic oxidation.

10. The semiconductor device according to claim 7, wherein the thin film transistor has a top-gate structure.

11. The semiconductor device according to claim 7, wherein the pixel electrode is in direct contact with a top surface and a side surface of an impurity doped region of the semiconductor layer.

12. The semiconductor device according to claim 7, wherein the thin film transistor has a polycrystalline silicon layer.

13. A semiconductor device comprising:
a substrate;
a thin film transistor including a semiconductor layer over the substrate;
a gate wiring electrically connected to a gate electrode of the thin film transistor, the gate wiring comprising aluminum;
a second wiring intersecting the gate wiring and electrically connected to the thin film transistor;
a storage capacitive wiring which extends in parallel with the gate wiring wherein the storage capacitive wiring is formed on a same insulating surface as the gate wiring;
an organic layer formed over the storage capacitive wiring and the thin film transistor; and
a pixel electrode formed over the organic layer,
wherein the storage capacitive wiring has at least first and second portions formed of a same material, the first portion extending under the pixel electrode and having a first width, and the second portion extending across the second wiring and having a second width narrower than the first width, and
wherein the same material is selected from the group consisting of tantalum and titanium.

14. The semiconductor device according to claim 13, wherein the semiconductor device is a liquid crystal display device.

15. The semiconductor device according to claim 13, wherein a surface of the gate wiring is provided with an oxide film which is formed by anodic oxidation.

16. The semiconductor device according to claim 13, wherein the thin film transistor has a polycrystalline silicon layer.

* * * * *